United States Patent
Kobayashi

(10) Patent No.: US 11,956,936 B2
(45) Date of Patent: Apr. 9, 2024

(54) SHIELDED CABLE, SHIELDED CABLE WITH CIRCUIT BOARD, AND MULTICORE CABLE

(71) Applicant: SUMITOMO ELECTRIC INDUSTRIES, LTD., Osaka (JP)

(72) Inventor: Yuto Kobayashi, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/823,204

(22) Filed: Aug. 30, 2022

(65) Prior Publication Data

US 2023/0066194 A1  Mar. 2, 2023

(30) Foreign Application Priority Data

Sep. 2, 2021  (JP) .................... 2021-143454

(51) Int. Cl.
| | | |
|---|---|---|
| H01B 7/08 | (2006.01) | |
| H01B 7/00 | (2006.01) | |
| H01B 7/02 | (2006.01) | |
| H01B 11/06 | (2006.01) | |
| H05K 9/00 | (2006.01) | |

(52) U.S. Cl.
CPC ......... *H05K 9/0098* (2013.01); *H01B 7/0009* (2013.01); *H01B 7/0216* (2013.01); *H05K 9/0084* (2013.01)

(58) Field of Classification Search
CPC .... H01B 7/0807; H01B 7/0225; H01B 7/221; H01B 11/06
See application file for complete search history.

(56) References Cited

U.S. PATENT DOCUMENTS

| | | | |
|---|---|---|---|
| 8,791,366 B2* | 7/2014 | Nonen ............ | H01R 13/65915 |
| | | | 174/113 R |
| 9,349,508 B2* | 5/2016 | Nonen .................. | H01B 11/20 |
| 9,384,873 B2* | 7/2016 | Yonezawa ............ | H01B 11/002 |
| 2011/0100682 A1* | 5/2011 | Nonen ................. | H01B 11/203 |
| | | | 174/254 |
| 2011/0315419 A1* | 12/2011 | Grant ..................... | H01B 11/06 |
| | | | 174/34 |
| 2018/0075948 A1* | 3/2018 | Kobayashi ............ | H01B 11/20 |
| 2018/0096755 A1 | 4/2018 | Tsujino et al. | |

(Continued)

FOREIGN PATENT DOCUMENTS

| | | |
|---|---|---|
| JP | 2018-060685 | 4/2018 |
| JP | 2018-067435 | 4/2018 |

(Continued)

*Primary Examiner* — Chau N Nguyen

(74) *Attorney, Agent, or Firm* — IPUSA, PLLC

(57) ABSTRACT

A shielded cable includes a first insulated wire including a first central conductor, and a first insulating layer provided around the first central conductor, a second insulated wire including a second central conductor, and a second insulating layer provided around the second central conductor, the second insulated wire being disposed parallel to the first insulated wire, a third insulating layer provided around the first insulated wire and the second insulated wire, a shielding layer provided around the third insulating layer, a drain wire in contact with the shielding layer, and a fourth insulating layer provided around the shielding layer and the drain wire.

9 Claims, 11 Drawing Sheets

(56) References Cited

U.S. PATENT DOCUMENTS

| | | | |
|---|---|---|---|
| 2018/0102204 A1* | 4/2018 | Li | ............................ H01B 7/17 |
| 2018/0108455 A1 | 4/2018 | Kobayashi | |
| 2019/0172610 A1 | 6/2019 | Yanagawa et al. | |
| 2020/0321142 A1 | 10/2020 | Kobayashi | |
| 2022/0215987 A1* | 7/2022 | Chen | .................. H01B 11/1091 |

FOREIGN PATENT DOCUMENTS

| | | |
|---|---|---|
| WO | 2019/082437 | 5/2019 |
| WO | 2019/131500 | 7/2019 |

* cited by examiner

SHIELDED CABLE, SHIELDED CABLE WITH CIRCUIT BOARD, AND MULTICORE CABLE

CROSS-REFERENCE TO RELATED APPLICATIONS

This application is based upon and claims priority to Japanese Patent Application No. 2021-143454 filed on Sep. 2, 2021, the entire contents of which are incorporated herein by reference.

BACKGROUND OF THE INVENTION

1. Field of the Invention

The present disclosure relates to shielded cables, shielded cables with circuit boards, and multicore cables.

2. Description of the Related Art

Shielded cable having a conductive shielded tape wound around a pair of parallel insulated wires, and an insulating tape wound around an outer side of the shielded tape have been proposed in Japanese Laid-Open Patent Publication No. 2018-060685, Japanese Laid-Open Patent Publication No. 2018-067435, International Publication Pamphlet No. WO 2019/082437, and International Publication Pamphlet No. WO 2019/131500, for example.

According to the shielded cable disclosed in Japanese Laid-Open Patent Publication No. 2018-060685, for example, an intended purpose thereof can be achieved. However, in recent years, there are desires to further reduce the size of the shielded cable.

SUMMARY OF THE INVENTION

According to one aspect of the present disclosure, a shielded cable includes a first insulated wire including a first central conductor, and a first insulating layer provided around the first central conductor; a second insulated wire including a second central conductor, and a second insulating layer provided around the second central conductor, the second insulated wire being disposed parallel to the first insulated wire; a third insulating layer provided around the first insulated wire and the second insulated wire; a shielding layer provided around the third insulating layer; a drain wire in contact with the shielding layer; and a fourth insulating layer provided around the shielding layer and the drain wire.

Other objects and further features of the present disclosure will be apparent from the following detailed description when read in conjunction with the accompanying drawings.

DESCRIPTION OF THE EMBODIMENTS

Figure 1:
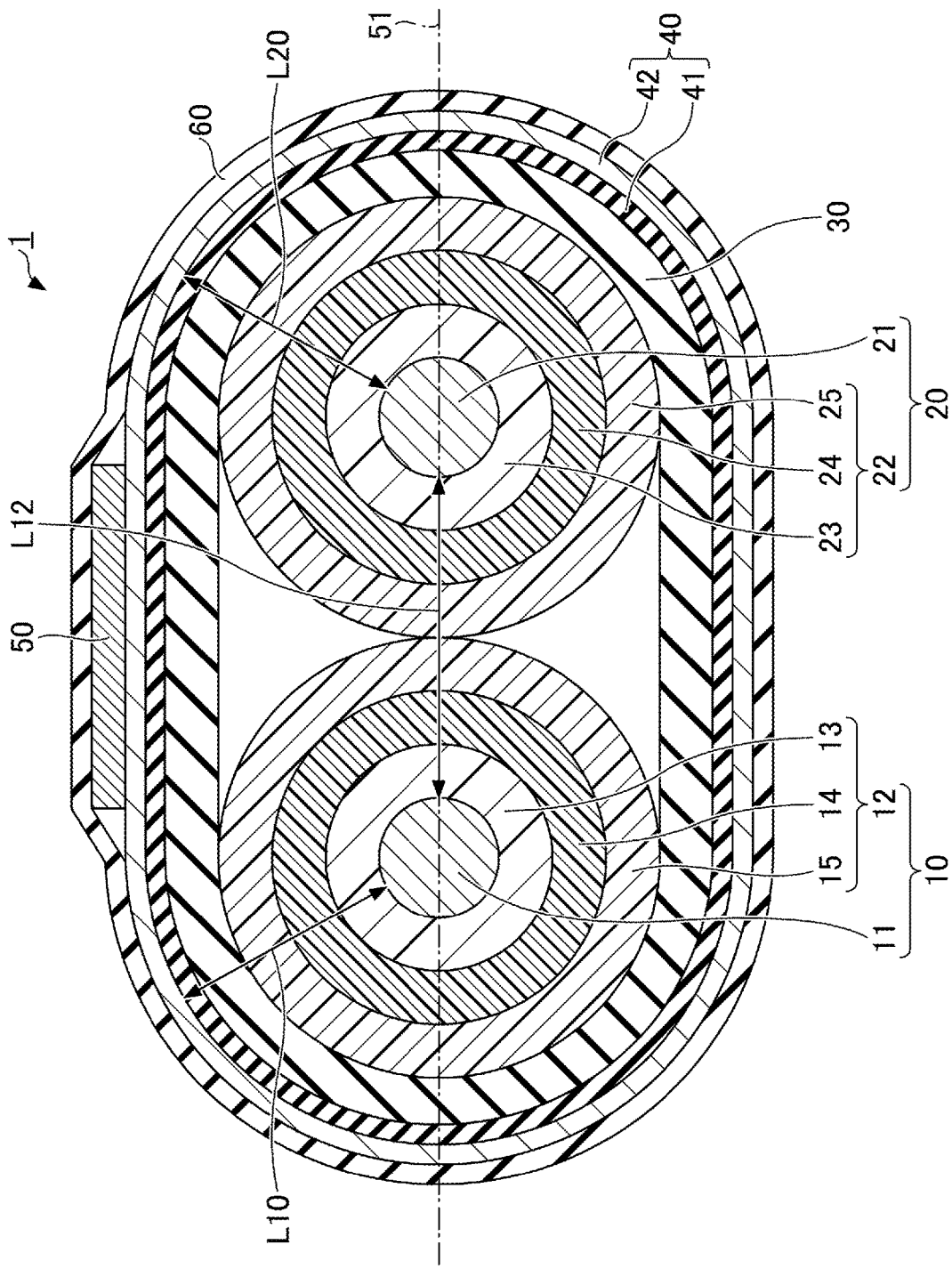
FIG. 1 is a cross sectional view illustrating a shielded cable according to a first embodiment.

Embodiments of the present disclosure will be described in the following. In the following description, the same or corresponding elements are designated by the same reference numerals, and a description of the same or corresponding elements will be omitted.

One object according to one aspect of the present disclosure is to provide a shielded cable, a shielded cables with a circuit board, and a multicore cable that can be reduced in size while enabling an excellent high-frequency signal quality to be obtained.

[1] A shielded cable according to one aspect of the present disclosure includes a first insulated wire including a first central conductor, and a first insulating layer provided around the first central conductor; a second insulated wire including a second central conductor, and a second insulating layer provided around the second central conductor, the second insulated wire being disposed parallel to the first insulated wire; a third insulating layer provided around the first insulated wire and the second insulated wire; a shielding layer provided around the third insulating layer; a drain wire in contact with the shielding layer; and a fourth insulating layer provided around the shielding layer and the drain wire.

The third insulating layer is provided between the shielding layer and each of the first insulated wire and the second insulated wire. For this reason, even if a distance between the first central conductor and the second central conductor is set to a small value, it is possible to suitably adjust an impedance of the first insulated wire and the second insulated wire. For this reason, it is possible to reduce the distance between the first central conductor and the second central conductor, and reduce the size of the shielded cable, while obtaining an excellent high-frequency signal quality.

[2] In the shielded cable of [1] above, a distance between the first central conductor and the second central conductor may be less than two times a distance between the first central conductor and the shielding layer, and less than two times a distance between the second central conductor and the shielding layer. In this case, it is possible to reduce the size of the shielded cable with ease.

[3] In the shielded cable of [1] or [2] above, the drain wire may have a flat shape. In this case, it is possible to reduce a thickness of the shielded cable with ease.

[4] In the shielded cable of any one of [1] to above, the first insulating layer may include a first solid layer provided around the first central conductor, and the second insulating layer may include a second solid layer provided around the second central conductor. In this case, it is possible to secure a desired mechanical strength of the first insulated wire and the second insulated wire.

[5] In the shielded cable of [4] above, the first insulating layer may include a first foam layer provided around the first solid layer, and the second insulating layer may include a second foam layer provided around the second solid layer. In this case, it is possible to obtain a desired impedance of the first insulated wire and the second insulated wire with ease.

[6] In the shielded cable of [5] above, the first insulating layer may include a third solid layer provided around the first foam layer, and the second insulating layer may include a fourth solid layer provided around the second foam layer. In this case, it is possible to obtain the desired impedance of the first insulated wire and the second insulated wire with more ease.

[7] In the shielded cable of [6] above, the third insulating layer may be thicker than the first solid layer, the second solid layer, the third solid layer, and the fourth solid layer. In this case, it is possible to adjust the impedance with ease, while reducing the distance between the first central conductor and the second central conductor.

[8] In the shielded cable of any one of [1] to above, the shielding layer may include a plating layer formed on an outer peripheral surface of the third insulating layer. In this case, it is possible to improve a transmission quality of the high-frequency signal with ease.

[9] In the shielded cable of any one of [1] to above, the shielding layer may include a metal film in contact with the drain wire. In this case, it is possible to manufacture the shielded cable with ease.

[10] In the shielded cable of [9] above, the drain wire may be provided between the metal film and the fourth insulating layer. In this case, it is possible to wind the shielding layer on the third insulating layer with ease.

[11] In the shielded cable of [9] above, the drain wire may be provided between the third insulating layer and the metal film. In this case, it is possible to wind the drain wire on the third insulating layer with ease.

[12] In the shielded cable of any one of [1] to above, a width of the drain wire may be less than or equal to a distance between the first central conductor and the second central conductor. In this case, it is possible to easily dispose the drain wire on a flat portion of the third insulating layer along a longitudinal direction.

[13] In the shielded cable of any one of [1] to above, the shielding layer may be longitudinally lapped around the third insulating layer, and when viewed in a direction perpendicular to a longitudinal direction, an inner end and an outer end of the shielding layer may be disposed at positions separated from the drain wire in a circumferential direction of the third insulating layer. In this case, even in a case where an undulation or a concavo-convex portion is generated on the third insulating layer due to an overlap of the inner end and the outer end of the shielding layer, the drain wire can be disposed at a position separated from the undulation or concavo-convex portion.

[14] According to another aspect of the present disclosure, a shielded cable includes a first insulated wire including a first central conductor, and a first insulating layer provided around the first central conductor; a second insulated wire including a second central conductor, and a second insulating layer provided around the second central conductor, the second insulated wire being disposed parallel to the first insulated wire; a third insulating layer provided around the first insulated wire and the second insulated wire; a shielding layer provided around the third insulating layer; a drain wire in contact with the shielding layer; and a fourth insulating layer provided around the shielding layer and the drain wire, wherein a distance between the first central conductor and the second central conductor is less than or equal to 1.6 times a distance between the first central conductor and the shielding layer, and less than or equal to 1.6 times a distance between the second central conductor and the shielding layer, the drain wire has a flat shape, the first insulating layer includes a first solid layer provided around the first central conductor, a first foam layer provided around the first solid layer, and a third solid layer provided around the first foam layer, the second insulating layer includes a second solid layer provided around the second central conductor, a second foam layer provided around the second solid layer, and a fourth solid layer provided around the second foam layer, and the shielding layer includes a plating layer formed on an outer peripheral surface of the third insulating layer.

The third insulating layer is provided between the shielding layer and each of the first insulated wire and the second insulated wire. In addition, the distance between the first central conductor and the second central conductor is less than or equal to 1.6 times the distance between the first central conductor and the shielding layer, and is less than or equal to 1.6 times the distance between the second central conductor and the shielding layer. For this reason, it is possible to reduce the distance between the first central conductor and the second central conductor, and reduce the size of the shielded cable, while obtaining an excellent high-frequency signal quality.

[15] According to still another aspect of the present disclosure, a shielded cable with a circuit board includes the shielded cable of any one of [1] to [14] above; and the circuit board connected to the shielded cable, wherein the circuit board includes an insulating base, a first conductive layer electrically connected to the first central conductor, a second conductive layer electrically connected to the second central conductor, a third conductive layer electrically connected to the drain wire, the first conductive layer, the second conductive layer, and the third conductive layer are provided on a surface of the insulating base, the first conductive layer, the second conductive layer, and the third conductive layer extend parallel to each other, and the third conductive layer is disposed between the first conductive layer and the second conductive layer. In this case, it is possible to reduce the size of the shielded cable with the circuit board, while obtaining an excellent high-frequency signal quality.

[16] According to a further aspect of the present disclosure, a shielded cable with a circuit board includes the shielded cable of any one of [1] to [14] above; and the circuit board connected to the shielded cable, wherein the circuit board includes an insulating base, a first conductive layer electrically connected to the first central conductor, a second conductive layer electrically connected to the second central conductor, a third conductive layer electrically connected to the drain wire, the first conductive layer, the second conductive layer, and the third conductive layer are provided on a surface of the insulating base, the insulating base makes contact with a portion of the fourth insulating layer on an opposite side from the first central conductor and the second central conductor with reference to the drain wire, the first conductive layer and the second conductive layer extend parallel to each other, and the third conductive layer extends in a direction perpendicular to a direction in which the first conductive layer extends. In this case, it is possible to reduce the size of the shielded cable with the circuit board, while obtaining an excellent high-frequency signal quality.

[17] According to another aspect of the present disclosure, a multicore cable includes a plurality of shielded cables each having a configuration of any one of [1] to [14] above; and an outer sheath accommodating the plurality of shielded cables.

It is possible to reduce the size of the shielded cable included in the multicore cable, while obtaining an excellent high-frequency signal quality. Accordingly, it is possible to also reduce the size of the multicore cable. Further, it is possible to transmit large-capacity signals by the multicore cable.

Details of Embodiments of the Present Disclosure

Embodiments of the present disclosure will now be described in detail, but the present disclosure is not limited the described embodiments. In the present specification and the drawings, constituent elements having substantially the same functional structures are designated by the same reference numerals, and a repeated description thereof may be omitted.

First Embodiment

A first embodiment will be described. The first embodiment relates to a shielded cable. FIG. 1 is a cross sectional view illustrating a shielded cable according to the first embodiment. FIG. 1 illustrates a cross section perpendicular to a longitudinal direction (an example of a first direction) of the shielded cable.

A shielded cable 1 according to the first embodiment is a twinax cable, for example. As illustrated in FIG. 1, the shielded cable 1 includes, among other things, an insulated wire 10, an insulated wire 20, an insulating layer 30, a shielding layer 40, a drain wire 50, and an insulating layer 60. The insulated wire 10 and the insulated wire 20 are arranged side by side and parallel to each other. For example, the insulated wire 10 and the insulated wire 20 are arranged in a direction (an example of a second direction) perpendicular to the longitudinal direction. The insulated wire 10 and the insulated wire 20 are in contact with each other.

The insulated wire 10 includes a central conductor 11, and an insulating layer 12 provided around the central conductor 11. The insulating layer 12 covers a periphery of the central conductor 11. The insulating layer 12 includes a solid layer 13 (an example of an inner solid layer), a foam layer 14, and a solid layer 15 (an example of an outer solid layer). The central conductor 11 is an example of a first central conductor. The insulating layer 12 is an example of a first insulating layer.

A material used for the central conductor 11 is a metal, such as copper, aluminum, or the like, for example. The central conductor 11 may be plated with tin, silver, or the like. The central conductor 11 may be a single wire or a twisted wire. Dimensions of the central conductor 11 are in conformance with AWG34 through AWG22 of the American Wire Gauge (AWG) standard, for example. The diameter is 0.160 mm in the AWG34, and the diameter is 0.643 mm in the AWG22.

The solid layer 13 is provided around the central conductor 11. The solid layer 13 makes contact with an outer peripheral surface of the central conductor 11. The solid layer 13 covers the outer peripheral surface of the central conductor 11. A material used for the solid layer 13 is polyethylene (PE), polypropylene (PP), or thermoplastic polyolefin (TPO), for example. A thickness of the solid layer 13 is in a range greater than or equal to 0.01 mm and less than or equal to 1.00 mm, for example. The solid layer 13 is an example of a first solid layer.

The foam layer 14 is provided around the solid layer 13. The foam layer 14 makes contact with an outer peripheral surface of the solid layer 13. The foam layer 14 covers the outer peripheral surface of the solid layer 13. A material used for the foam layer 14 is PE, PP or TPO, for example. A thickness of the foam layer 14 is in a range greater than or equal to 0.01 mm and less than or equal to 1.00 mm, for example. The foam layer 14 is an example of a first foam layer.

The solid layer 15 is provided around the foam layer 14. The solid layer 15 makes contact with an outer peripheral surface of the foam layer 14. The solid layer 15 covers the outer peripheral surface of the foam layer 14. A material used for the solid layer 15 is PE, PP or TPO, for example. A thickness of the solid layer 15 is in a range greater than or equal to 0.01 mm and less than or equal to 1.00 mm, for example. The solid layer 15 is an example of a third solid layer.

The foam layer 14 is thicker than the solid layer 13 and the solid layer 15. The thickness of the solid layer 13 and the thickness of the solid layer 15 may be the same. Alternatively, the solid layer 15 may be thicker than the solid layer 13. For example, the foam layer 14 has a thickness of 0.20 mm, the solid layer 13 has a thickness of 0.08 mm, and the solid layer 15 has a thickness of 0.08 mm.

The solid layer 13, the foam layer 14, and the solid layer 15 are formed, for example, by pressurized extrusion of three layers together, namely, the solid layer 13, the foam layer 14, and the solid layer 15.

The insulated wire 20 includes a central conductor 21, and an insulating layer 22 provided around the central conductor 21. The insulating layer 22 covers a periphery of the central conductor 21. The insulating layer 22 has the same structure as the insulating layer 12. The insulating layer 22 includes a solid layer 23 (an example of an inner solid layer), a foam layer 24, and a solid layer 25 (an example of an outer solid layer). The central conductor 21 is an example of a second central conductor. The insulating layer 22 is an example of a second insulating layer.

A material used for the central conductor 21 is a metal, such as copper, aluminum, or the like, for example. The central conductor 21 may be plated with tin, silver, or the like. The central conductor 21 may be a single wire or a twisted wire. Dimensions of the central conductor 21 are in conformance with the AWG34 through AWG22 of the AWG standard, for example.

The solid layer 23 is provided around the central conductor 21. The solid layer 23 makes contact with an outer peripheral surface of the central conductor 21. The solid layer 23 covers the outer peripheral surface of the central conductor 21. A material used for the solid layer 23 is PE, PP or TPO, for example. A thickness of the solid layer 23 is in a range greater than or equal to 0.01 mm and less than or equal to 1.00 mm, for example. The solid layer 23 is an example of a second solid layer.

The foam layer 24 is provided around the solid layer 23. The foam layer 24 makes contact with an outer peripheral surface of the solid layer 23. The foam layer 24 covers the outer peripheral surface of the solid layer 23. A material used for the foam layer 24 is PE, PP or TPO, for example. A thickness of the foam layer 24 is in a range greater than or equal to 0.01 mm and less than or equal to 1.00 mm, for example. The foam layer 24 is an example of a second foam layer.

The solid layer 25 is provided around the foam layer 24. The solid layer 25 makes contact with an outer peripheral surface of the foam layer 24. The solid layer 25 covers the outer peripheral surface of the foam layer 24. A material used for the solid layer 25 is PE, PP or TPO, for example. A thickness of the solid layer 25 is in a range greater than or equal to 0.01 mm and less than or equal to 1.00 mm or less, for example. The solid layer 25 is an example of a fourth solid layer.

The foam layer 24 is thicker than the solid layer 23 and the solid layer 25. The thickness of the solid layer 23 and the thickness of the solid layer 25 may be the same. Alternatively, the solid layer 25 may be thicker than the solid layer 23. For example, the foam layer 24 has a thickness of 0.20 mm, the solid layer 23 has a thickness of 0.08 mm, and the solid layer 25 has a thickness of 0.08 mm.

The solid layer 23, the foam layer 24, and the solid layer 25 are formed, for example, by pressurized extrusion of three layers together, namely, the solid layer 23, the foam layer 24, and the solid layer 25.

The insulating layer 30 is provided around the insulated wire 10 and the insulated wire 20. The insulating layer 30 includes an upper flat portion and a lower flat portion making contact with both the two insulated wires 10 and 20, respectively, and a first circular portion and a second circular portion making contact with both the two insulated wires 10 and 20, respectively. The insulating layer 30 makes contact with a portion of the outer peripheral surface of the insulated wire 10 on a side opposite from the insulated wire 20, and a portion of the outer peripheral surface of the insulated wire 20 on a side opposite from the insulated wire 10. A material used for the insulating layer 30 is PE, PP or TPO, for example. A thickness of the insulating layer 30 is in a range greater than or equal to 0.01 mm and less than or equal to 1.00 mm, for example. The insulating layer 30 is thicker than the solid layer 13, the solid layer 15, the solid layer 23, and the solid layer 25. The thickness of the insulating layer 30 may be 0.10 mm, for example. The insulating layer 30 is formed by tube extrusion, for example. The insulating layer 30 is an example of a third insulating layer.

The shielding layer 40 includes a resin tape 41, and a metal film 42. For example, the metal film 42 is adhered to or deposited on one surface of the resin tape 41. A material used for the resin tape 41 is a resin, such as polyethylene terephthalate (PET), polyvinyl chloride (PVC), or the like, for example. The metal film 42 is a copper film or an aluminum film, for example. A thickness of the shielding layer 40 is in a range greater than or equal to 7 µm and less than or equal to 100 µm, for example. A thickness of the metal film 42 is in a range greater than or equal to 4 µm and less than or equal to 60 µm, for example. The shielding layer 40 is wound around the insulating layer 30 and longitudinally lapped, in a state where the resin tape 41 makes contact with the insulating layer 30. Accordingly, the resin tape 41 is interposed between the insulating layer 30 and the metal film 42, and the metal film 42 is located on an outer side of the resin tape 41.

A material used for the drain wire 50 is a metal, such as copper, aluminum, or the like, for example. The drain wire 50 has a flat shape, and is tabular. For example, the drain wire 50 has a rectangular shape when viewed in a direction perpendicular to the longitudinal direction, that is, a rectangular cross sectional shape in a cross sectional view perpendicular to the longitudinal direction. The drain wire 50 is provided above the upper flat portion of the insulating layer 30. A thickness of the drain wire 50 is in a range greater than or equal to 10 µm and less than or equal to 100 µm, for example. A width of the drain wire 50 is in a range greater than or equal to 0.1 mm and less than or equal to 5.0 mm, for example. The drain wire 50 is provided on the outer side of the metal film 42 so as to make contact with the metal film 42 of the shielding layer 40. The drain wire 50 is formed by longitudinal lapping, for example. The drain wire 50 is electrically connected to the metal film 42. A direction (the example of the second direction) in which the insulated wire 10 and the insulated wire 20 are arranged, and a width direction of the drain wire 50, are approximately parallel to each other. The drain wire 50 overlaps contact portions of the insulated wire 10 and the insulated wire 20 in a plan view viewed in the direction perpendicular to the longitudinal direction (the example of the first direction), and also viewed in a direction (an example of a third direction) perpendicular to the direction (the example of the second direction) in which the insulated wire 10 and the insulated wire 20 are arranged side by side. Preferably, a center of the drain wire 50 in the width direction overlaps the contact portions of the insulated wire 10 and the insulated wire 20 in the plan view.

The insulating layer 60 is provided around shielding layer 40 and drain wire 50. A material used for the insulating layer 60 is a resin, such as PET, PVC, or the like, for example. A thickness of the insulating layer 60 is in a range greater than or equal to 4 µm and less than or equal to 50 µm, for example. The insulating layer 60 is formed by an insulating tape wound spirally (longitudinally lapped) around the shielding layer 40 and the drain wire 50, for example. The insulating layer 60 is provided around the shielding layer 40 and drain wire 50, to increase a mechanical strength of the shielding layer 40, and to prevent contamination from the outside. The insulating layer 60 is not limited to the insulating tape, and may be formed by pressurized extrusion or tube extrusion. The insulating layer 60 is an example of a fourth insulating layer.

In the shielded cable 1 according to the first embodiment, the insulating layer 30 is provided between the shielding layer 40 and each of the insulated wire 10 and the insulated wire 20. Accordingly, even if a distance between the central conductor 11 of the insulated wire 10 and the central conductor 21 of the insulated wire 20 is set to a small value, it is possible to suitably adjust an impedance of the insulated wire 10 and the insulated wire 20. For this reason, it is possible to reduce the distance between the central conductor 11 of the insulated wire 10 and the central conductor 21 of the insulated wire 20, and reduce the size of the shielded cable 1, while obtaining an excellent high-frequency signal quality.

For example, a distance L12 between the central conductor 11 and the central conductor 21 is less than two times a distance L10 between the central conductor 11 and the shielding layer 40, and less than two times a distance L20 between the central conductor 21 and the shielding layer 40. Hence, it is possible to easily reduce the size of the shielded cable 1. The distance L12 is preferably less than or equal to 1.8 times the distance L10 and less than or equal to 1.8 times the distance L20, and more preferably less than or equal to 1.6 times the distance L10 and less than or equal to 1.6 times the distance L20. The distance L12 may be approximately 1.5 times the distance L10 and approximately 1.5 times the distance L20.

In the present embodiment, the drain wire 50 has the flat shape. For this reason, a thickness of the shielded cable 1 can easily be reduced. The drain wire 50 is a flat rectangular conductor, for example.

In the present embodiment, the insulated wire 10 includes the solid layer 13, the foam layer 14, and the solid layer 15, while the insulated wire 20 includes the solid layer 23, the foam layer 24, and the solid layer 25. For this reason, it is easy to stabilize a transmission quality of the high-frequency signal.

It is not essential for the insulated wire 10 to include the solid layer 15, and it is not essential for the insulated wire 20 to include the solid layer 25. In addition, it is not essential for the insulated wire 10 to include the foam layer 14 and the solid layer 15, and it is not essential for the insulated wire 20 to include the foam layer 24 and the solid layer 25. In particular, in a case where a skew or a common mode conversion is to be improved, the insulated wire 10 may not include the foam layer 14, and the insulated wire 20 may not include the foam layer 24. In this case, the insulated wire 10 is formed by the solid layer 13 or the solid layer 15, and the insulated wire 20 is formed by the solid layer 23 or the solid layer 25. In particular, in a case where an insertion loss is to be improved, the foam layer 14 and the foam layer 24 are preferably provided. The structure of the insulating layer 12 is not limited to the three-layer structure including the solid layer 13, the foam layer 14, and the solid layer 15. The insulating layer 12 may have a two-layer structure including the solid layer 13 and the foam layer 14, or a two-layer structure including the foam layer 14 and the solid layer 15. Similarly, the structure of the insulating layer 22 is not limited to the three-layer structure including the solid layer 23, the foam layer 24, and the solid layer 25. The insulating layer 22 may have a two-layer structure including the solid layer 23 and the foam layer 24, or a two-layer structure including the foam layer 24 and the solid layer 25.

In the present embodiment, the drain wire 50 is provided between the metal film 42 and the insulating layer 60. For this reason, it is possible to easily wind the shielding layer 40 one the insulating layer 30.

A width of the drain wire 50 is less than or equal to the width of the upper flat portion of the insulating layer 30, that is, the distance between the center of the insulated wire 10 and the center of the insulated wire 20. The width of the drain wire 50 may be less than or equal to the distance L12 between the central conductor 11 and the central conductor 21. In a case where the width of the drain wire 50 is less than or equal to the distance L12, the drain wire 50 can easily be disposed at the upper flat portion of the insulating layer 30 along the longitudinal direction.

Next, an arrangement of an inner end and an outer end of the longitudinally lapped shielding layer 40, will now be described. The inner end of the shielding layer 40 is provided on a lower side (a side where the drain wire 50 is not disposed) of a plane 51 of a first circular portion or a second circular portion of the insulating layer 30. In addition, the outer end of the shielding layer 40 is provided on the lower flat portion of the insulating layer 30, or on the lower side of the plane 51 of the first circular portion or the second circular portion of the insulating layer 30. In other words, when viewed in the direction perpendicular to the longitudinal direction, at least the inner end and the outer end of the shielding layer 40 are preferably disposed at positions separated from the drain wire 50 along a circumferential direction of the insulating layer 30, and are preferably provided so as not to directly overlap the drain wire 50. Hence, even in a case where an undulation or a concavo-convex portion is generated on the insulating layer 30 due to an overlap of the inner end and the outer end of the shielding layer 40, the drain wire 50 can be disposed at a position separated from the undulation or concavo-convex portion.

Mode of Use of Shielded Cable 1

Next, a mode of use of the shielded cable 1 according to the first embodiment will be described. The shielded cable 1 is used in a state connected to a circuit board (or substrate) on which a conductive layer is formed, for example.

First Example of Mode of Use

Figure 2:
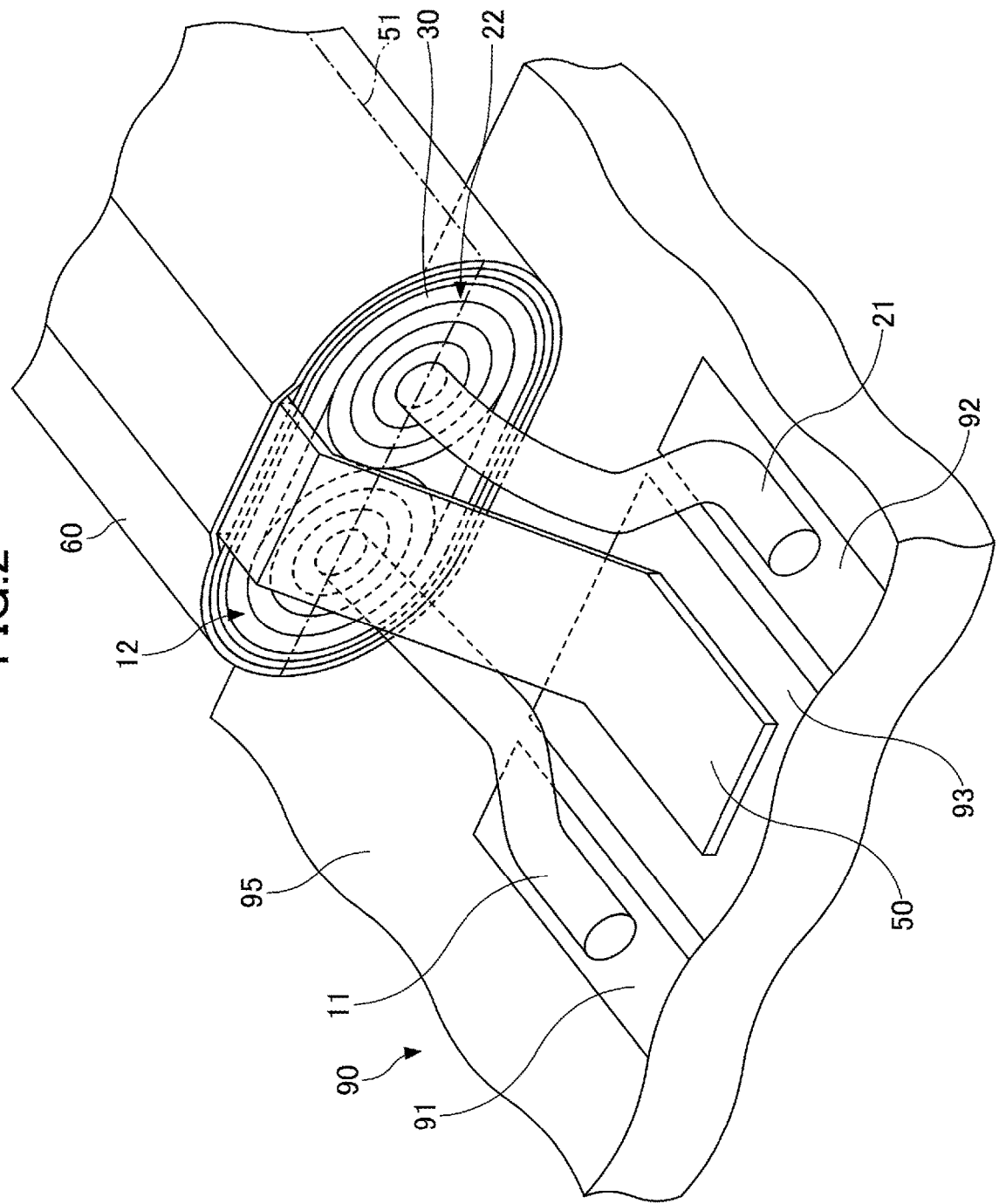
FIG. 2 is a schematic diagram illustrating a first example of a mode of use of the shielded cable according to the first embodiment.
Figure 3:
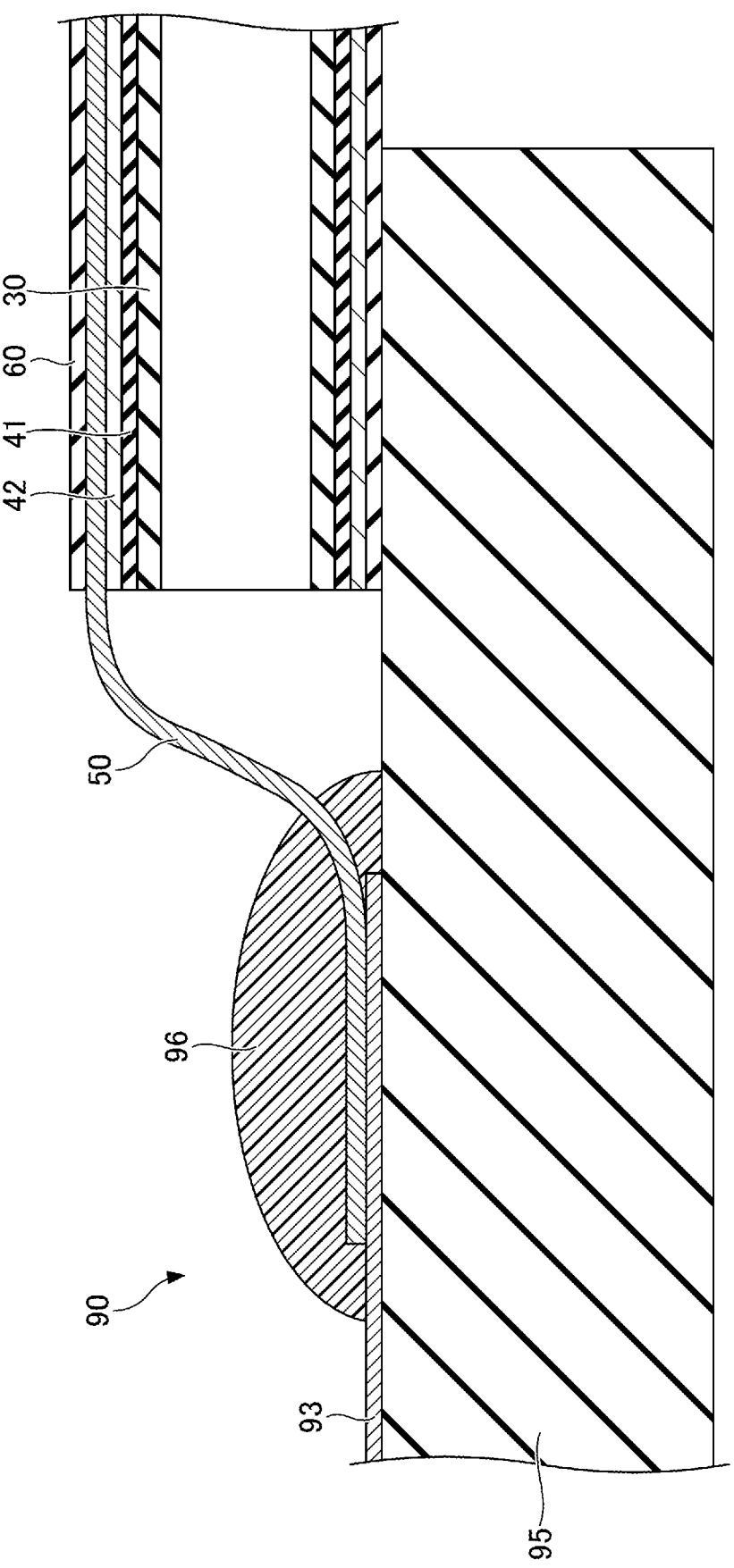
FIG. 3 is a cross sectional view (part 1) illustrating the first example of the mode of use of the shielded cable according to the first embodiment.
Figure 4:
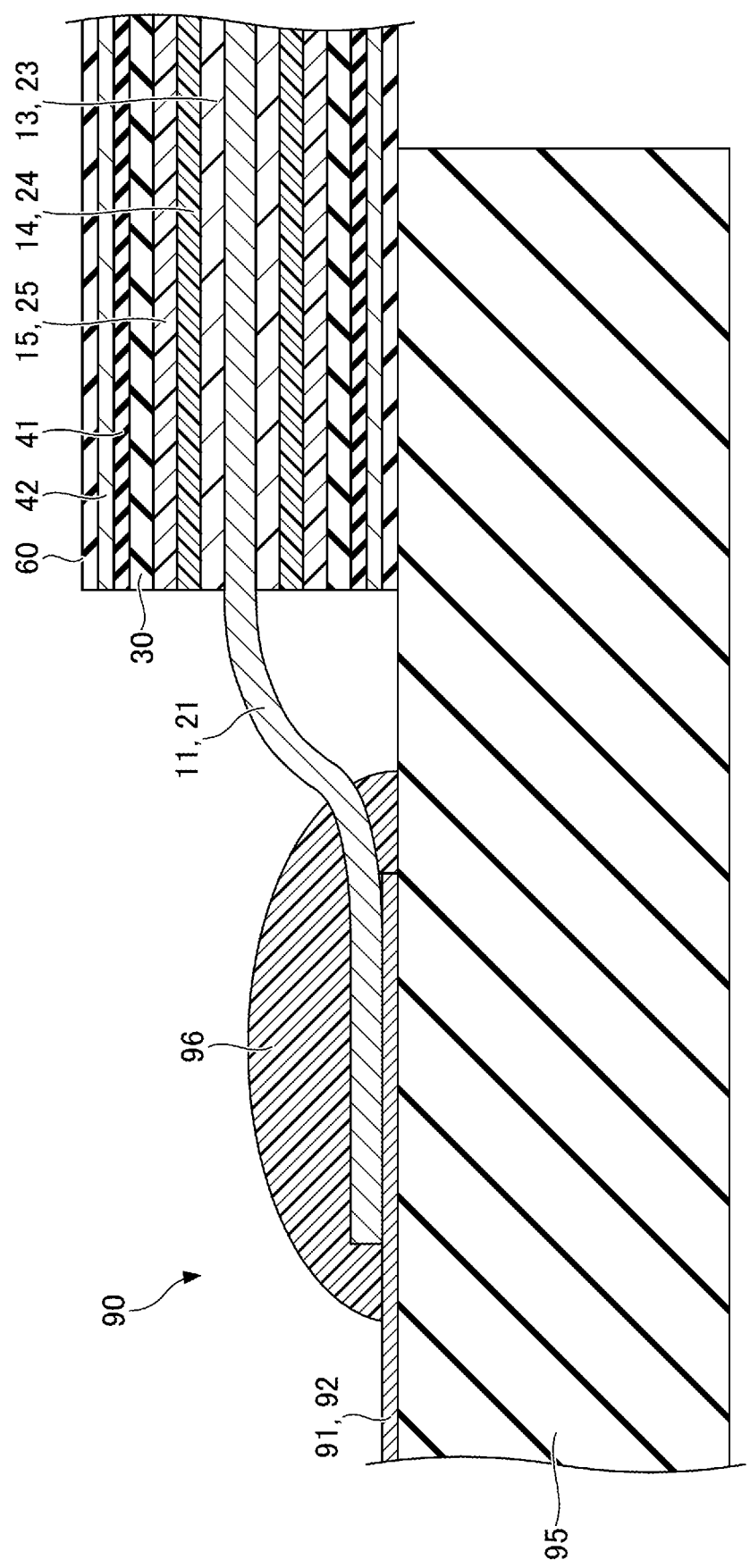
FIG. 4 is a cross sectional view (part 2) illustrating the first example of the mode of use of the shielded cable according to the first embodiment.

First, a first example of the mode of use will be described. The first example of the mode of use relates to a shielded cable with a circuit board. FIG. 2 is a schematic diagram illustrating the first example of the mode of use of the shielded cable according to the first embodiment. FIG. 3 and FIG. 4 are cross sectional views illustrating the first example of the mode of use of the shielded cable according to the first embodiment. FIG. 3 illustrates a cross sectional view along the drain wire, and FIG. 4 illustrates a cross sectional view along the central conductor.

As illustrated in FIG. 2 through FIG. 4, the shielded cable 1 is connected to a circuit board 90, for example. The circuit board 90 includes an insulating base 95, a conductive layer 91 for signal, a conductive layer 92 for signal, and a conductive layer 93 for ground. The conductive layers 91 through 93 are provided on a surface of the insulating base 95, and extend parallel to each other. The conductive layer 93 is disposed between the conductive layer 91 and the conductive layer 92. The conductive layer 91 is an example of a first conductive layer, the conductive layer 92 is an example of a second conductive layer, and the conductive layer 93 is an example of a third conductive layer.

In the first example, the drain wire 50 is disposed on an opposite side from the circuit board 90, with respect to a plane 51 that includes the central conductor 11 and the central conductor 21, as illustrated in FIG. 2 and FIG. 3. In other words, in the first example, the lower flat portion of the insulating layer 30 is positioned on the side closer to the insulating base 95 than to the plane 51. Further, the insulating layer 60 is provided on the insulating base 95 and in contact with the insulating base 95. The central conductor 11 is electrically connected to the conductive layer 91 via a bonding material (not illustrated), such as a solder or the like. The central conductor 21 is electrically connected to the conductive layer 92 via a bonding material (not illustrated), such as a solder or the like. The drain wire 50 is electrically connected to the conductive layer 93 via a bonding material (not illustrated), such as a solder or the like. The bonding material, such as the solder or the like, is covered with a resin 96.

Second Example of Mode of Use

Figure 5:
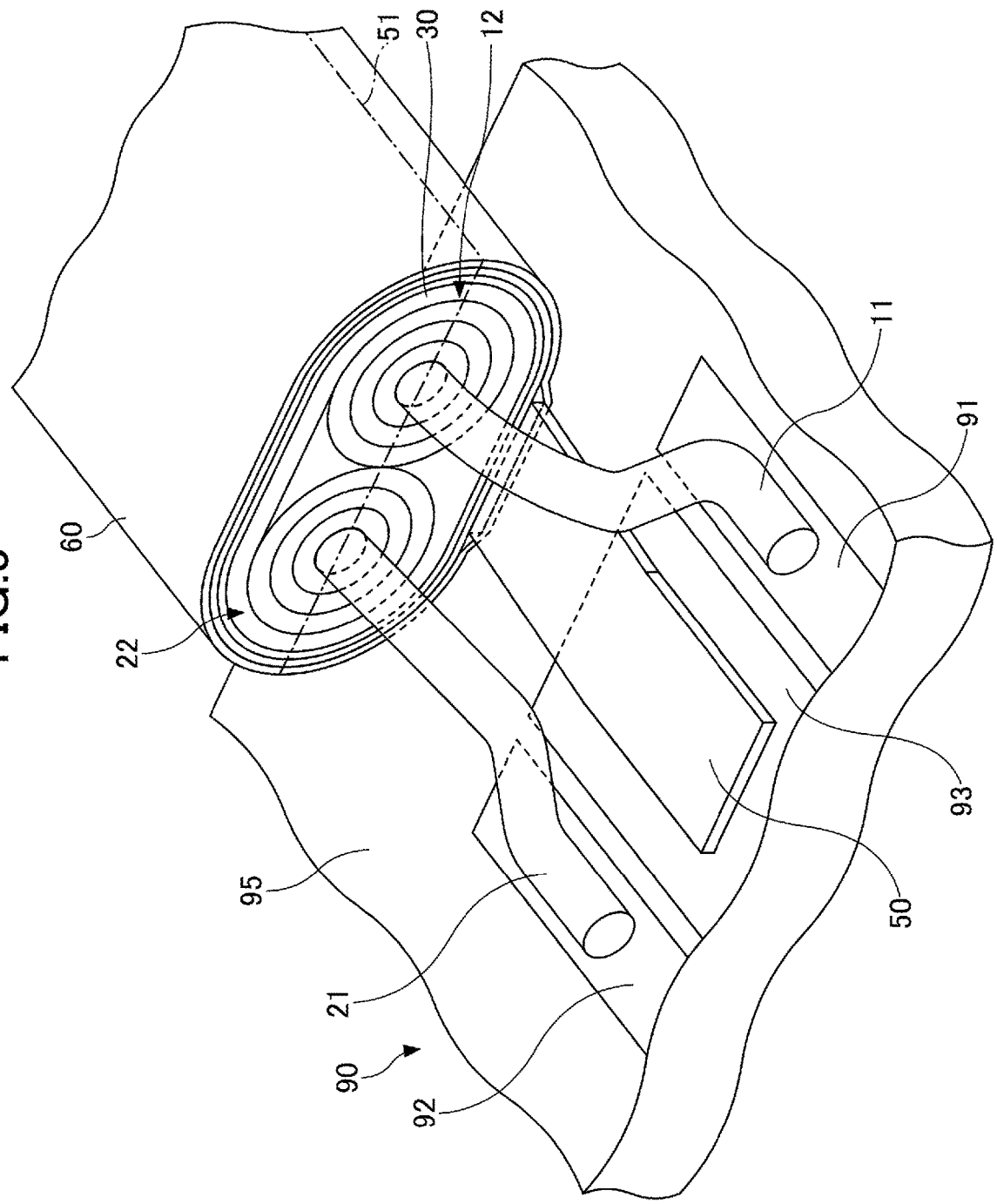
FIG. 5 is a schematic diagram illustrating a second example of the mode of use of the shielded cable according to the first embodiment.
Figure 6:
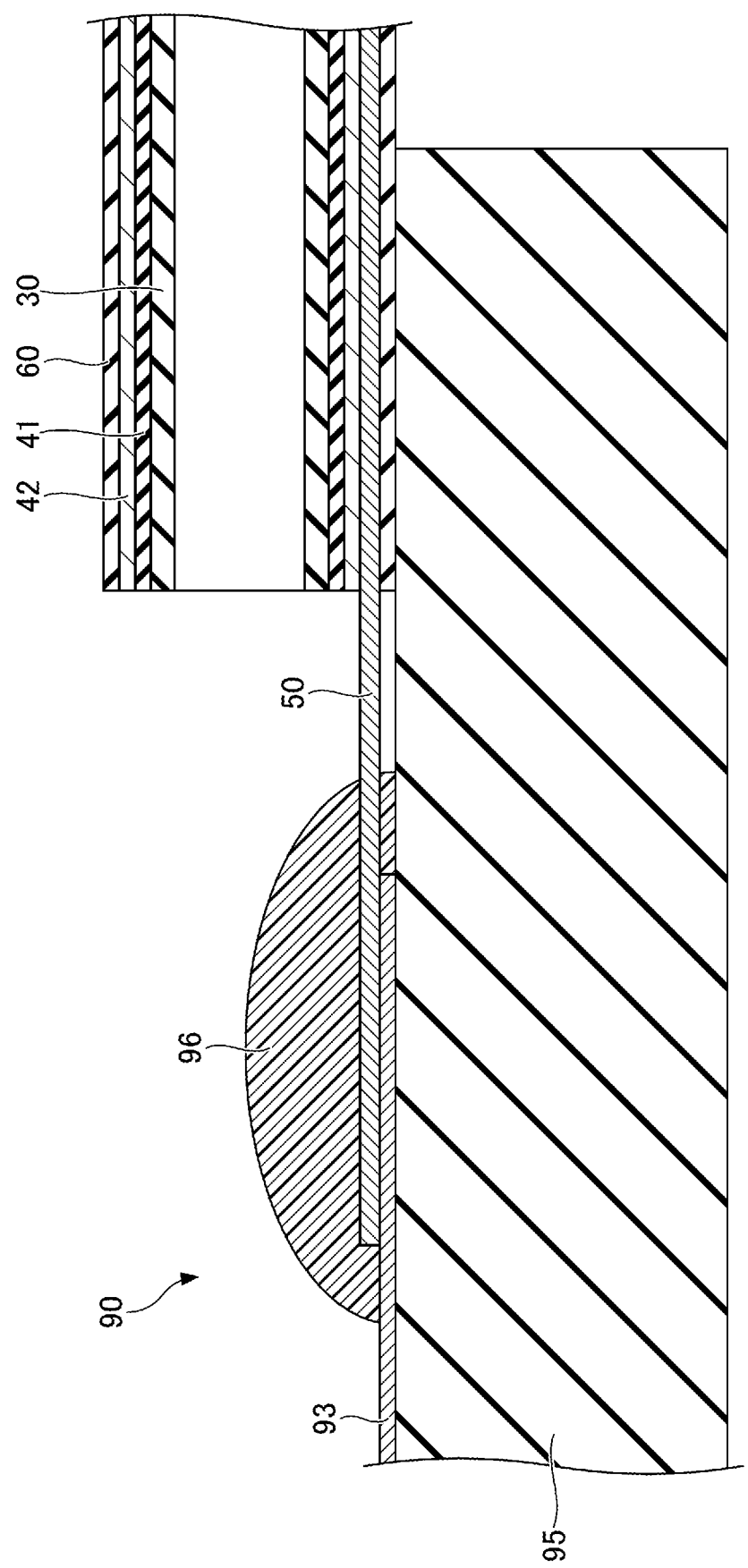
FIG. 6 is a cross sectional view illustrating the second example of the mode of use of the shielded cable according to the first embodiment.

Next, a second example of the mode of use will be described. The second example of the mode of use relates to the shielded cable with the circuit board. FIG. 5 is a schematic diagram illustrating the second example of the mode of use of the shielded cable according to the first embodiment. FIG. 6 is a cross sectional view illustrating the second example of the mode of use of the shielded cable according to the first embodiment. FIG. 6 illustrates a cross sectional view along the drain wire.

In the second example, the drain wire 50 is disposed on the side of the circuit board 90, with respect to the plane 51 including the central conductor 11 and the central conductor 21, as illustrated in FIG. 5 and FIG. 6. In other words, in the second example, the upper flat portion of the insulating layer 30 is positioned on the side closer to the insulating base 95 than to the plane 51. Further, the insulating layer 60 is disposed on the insulating base 95 and in contact with the insulating base 95. The central conductor 11 is electrically connected to the conductive layer 91 via a bonding material (not illustrated), such as a solder or the like. The central conductor 21 is electrically connected to the conductive layer 92 via a bonding material (not illustrated), such as a solder or the like. The drain wire 50 is electrically connected to the conductive layer 93 via a bonding material (not illustrated), such as a solder or the like. The bonding material, such as the solder or the like, is covered with the resin 96.

Third Example of Mode of Use

Figure 7:
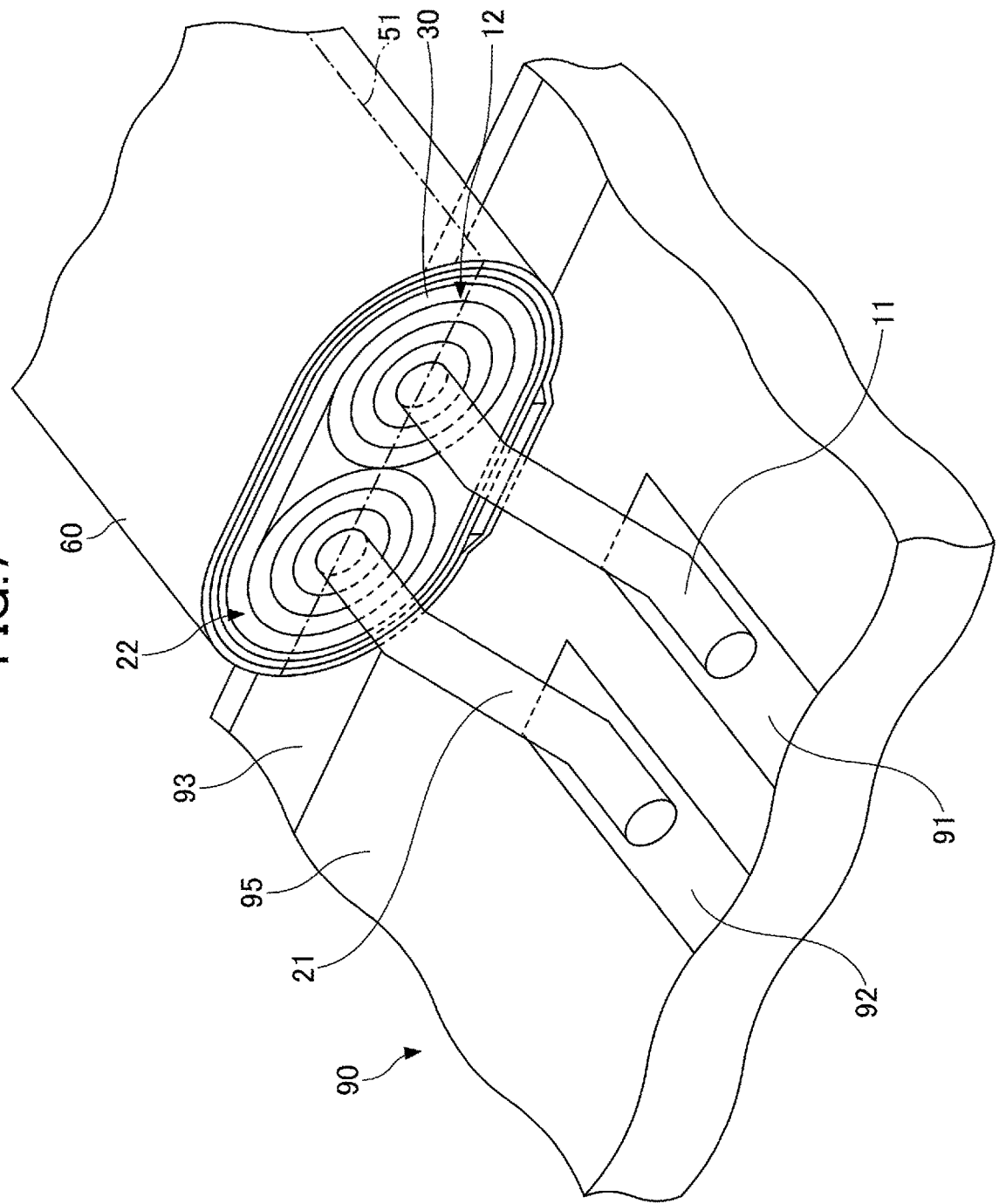
FIG. 7 is a schematic diagram illustrating a third example of the mode of use of the shielded cable according to the first embodiment.
Figure 8:
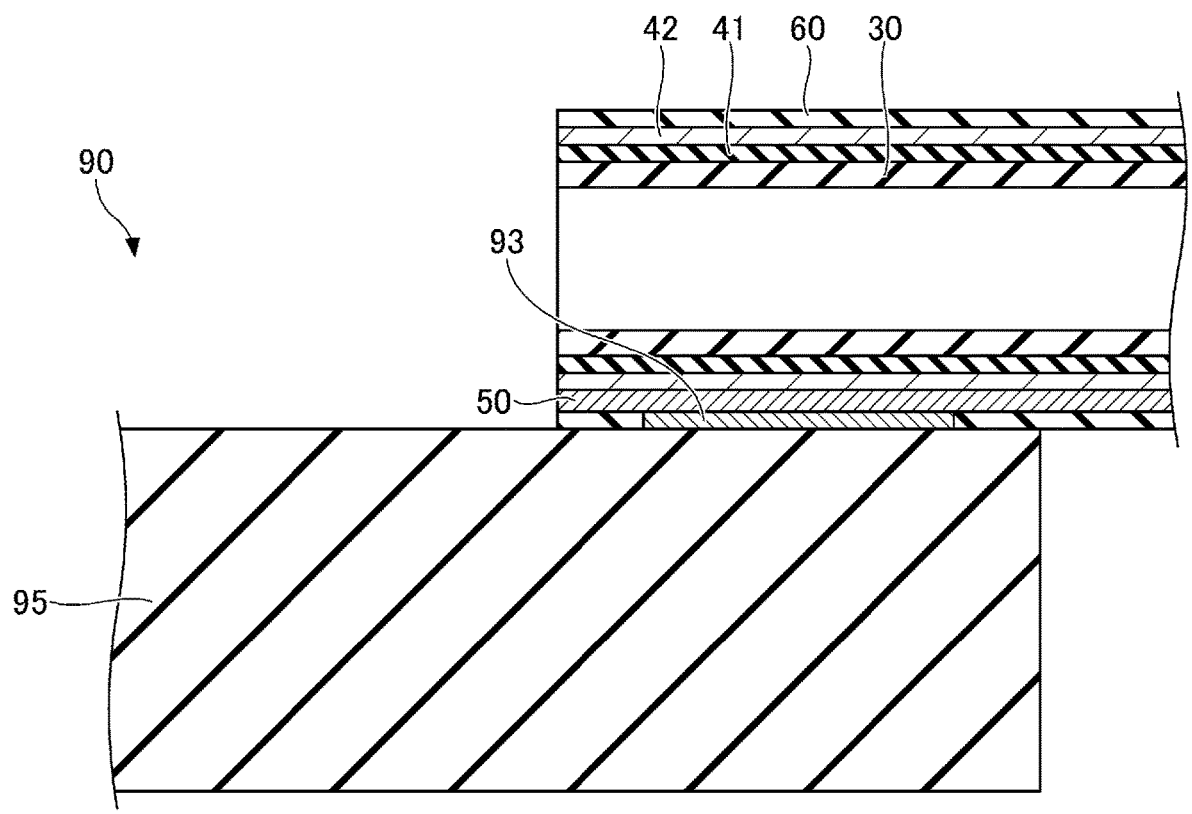
FIG. 8 is a cross sectional view illustrating the third example of the mode of use of the shielded cable according to the first embodiment.

Next, a third example of the mode of use will be described. The third example of the mode of use relates to the shielded cable with the circuit board. FIG. 7 is a schematic diagram illustrating the third example of the mode of use of the shielded cable according to the first embodiment. FIG. 8 is a cross sectional view illustrating the third example of the mode of use of the shielded cable according to the first embodiment. FIG. 8 illustrates a cross sectional view along the drain wire.

In the third example, the conductive layer 93 extends in the direction perpendicular to the direction in which the conductive layers 91 and 92 extend, as illustrated in FIG. 7 and FIG. 8. Similar to the second example, the drain wire 50 is disposed on the side of the circuit board 90, with respect to the plane 51 including the central conductor 11 and the central conductor 21. In other words, in the third example, the upper flat portion of the insulating layer 30 is positioned on the side closer to the insulating base 95 than to the plane 51. Further, the insulating layer 60 is disposed on the insulating base 95 and in contact with the insulating base 95. The insulating base 95 makes contact with a portion of the insulating layer 60 on the opposite side from the central conductor 11 and the central conductor 21, with reference to the drain wire 50. The central conductor 11 is electrically connected to the conductive layer 91 via a bonding material (not illustrated), such as a solder or the like. The central conductor 21 is electrically connected to the conductive layer 92 via a bonding material (not illustrated), such as a solder or the like. The bonding material, such as the solder or the like, is covered with the resin 96. A portion of the insulating layer 60 is stripped, to expose a portion of the drain wire 50 from the insulating layer 60, and the exposed portion of the drain wire 50 is electrically connected to the conductive layer 93 via a bonding material (not illustrated), such as an anisotropic conductive film or the like.

Second Embodiment

Figure 9:
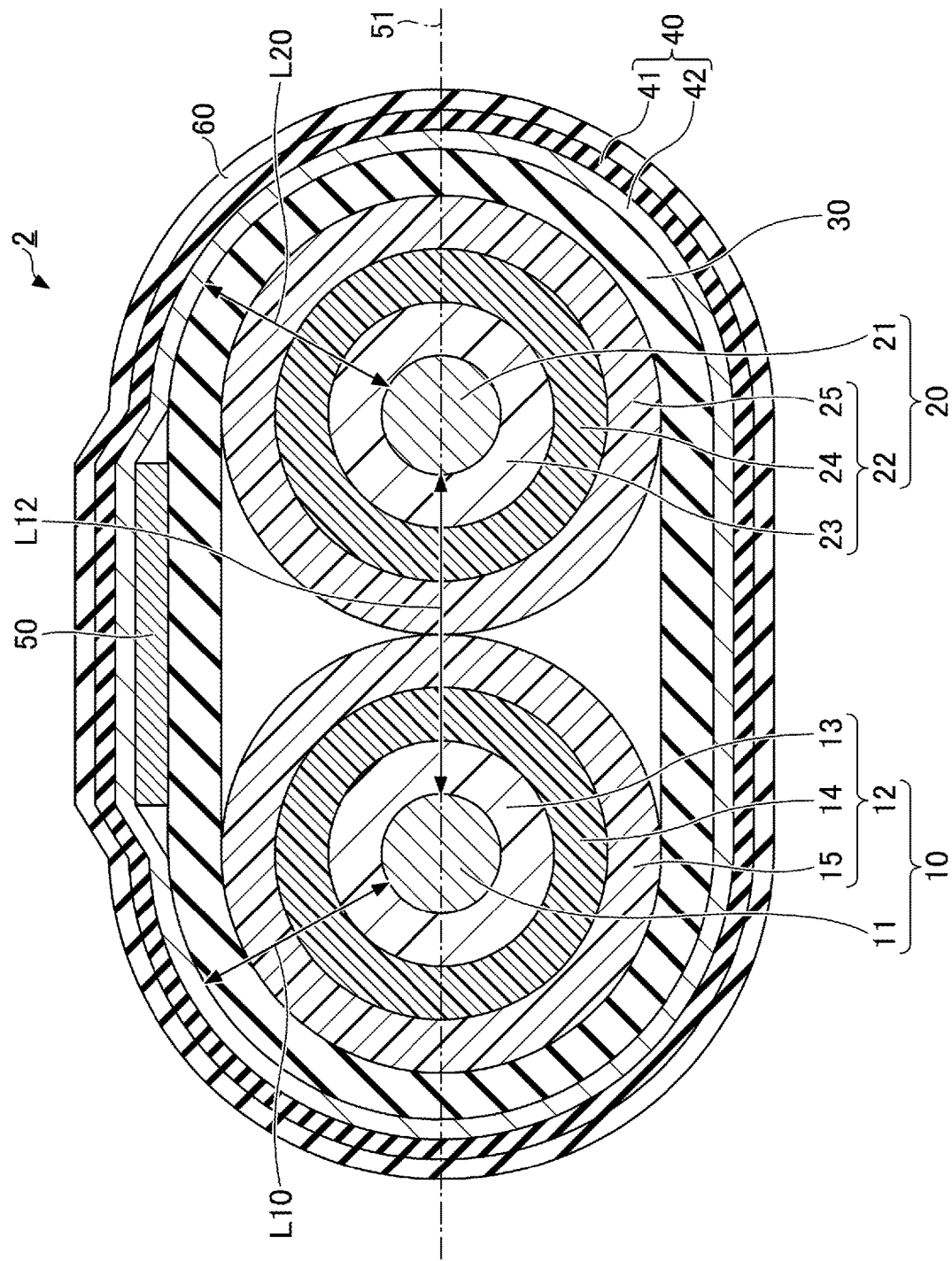
FIG. 9 is a cross sectional view illustrating the shielded cable according to a second embodiment.

A second embodiment will be described. The second embodiment differs from the first embodiment, among other things, in the positional relationship between the shielding layer 40 and the drain wire 50. FIG. 9 is a cross sectional view illustrating the shielded cable according to the second embodiment. FIG. 9 illustrates a cross section perpendicular to the longitudinal direction of the shielded cable.

As illustrated in FIG. 9, in a shielded cable 2 according to the second embodiment, the drain wire 50 is provided on the outer side of the insulating layer 30, so as to make contact with the insulating layer 30. The drain wire 50 is longitudinally lapped, for example. In addition, the shielding layer 40 is wound around the insulating layer 30 and the drain wire 50 and longitudinally lapped, so that the metal film 42 is in contact with the insulating layer 30 and the drain wire 50. Accordingly, a metal film 42 is interposed between the insulating layer 30 and the resin tape 41, and the resin tape 41 is located on the outer side of the metal film 42. The drain wire 50 is electrically connected to the metal film 42. The insulating layer 60 is provided around shielding layer 40. The insulating layer 60 is formed by an insulating tape wound spirally (longitudinally lapped) around the shielding layer 40.

Other configurations of the second embodiment are similar to those of the first embodiment.

Similar to the first embodiment, the second embodiment can obtain the effect of reducing the size of the shielded cable 2, while obtaining an excellent high-frequency signal quality. Moreover, in the present embodiment, the drain wire 50 is provided between the insulating layer 30 and the metal film 42. For this reason, the drain wire 50 can easily be provided on the insulating layer 30.

Third Embodiment

Figure 10:
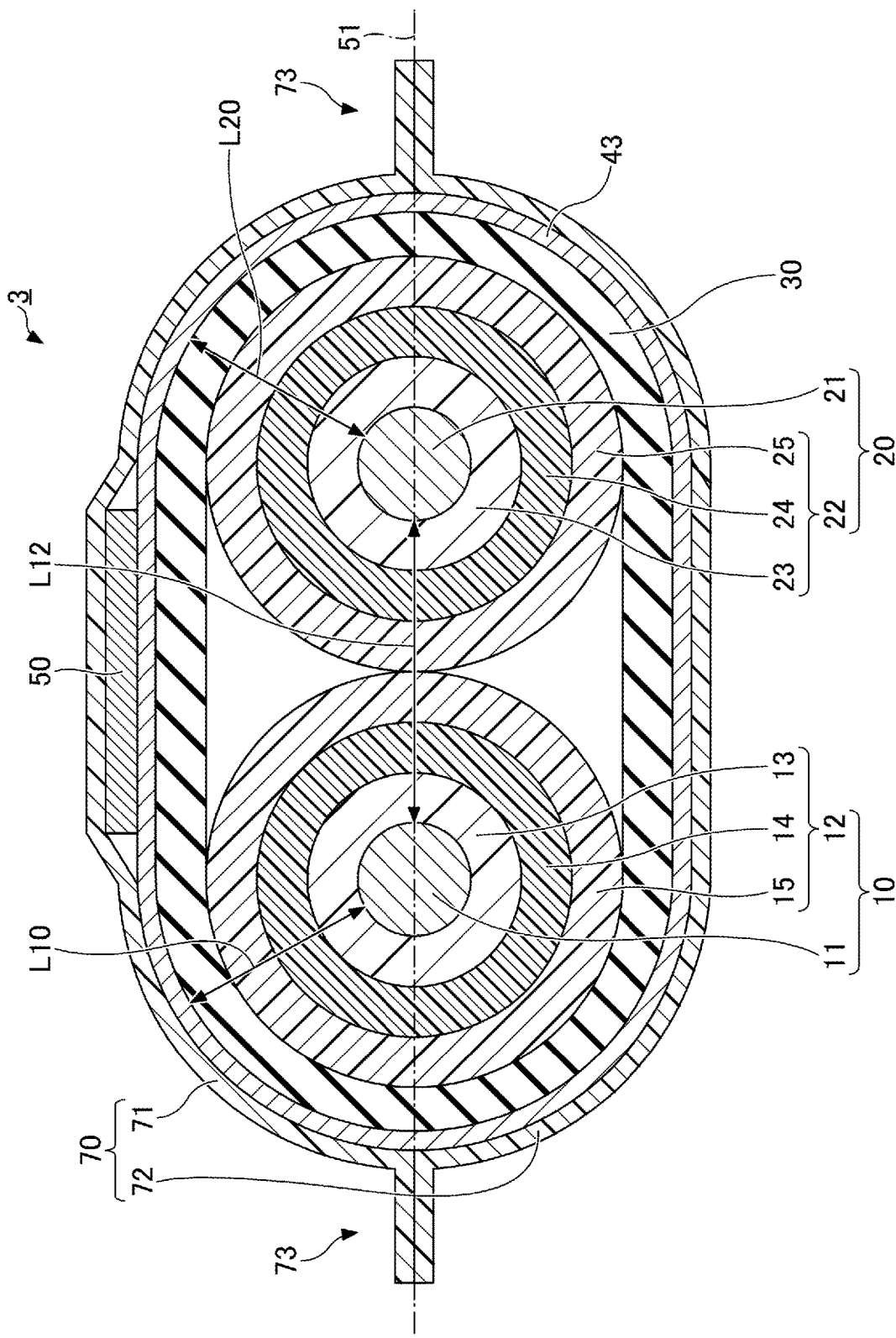
FIG. 10 is a cross sectional view illustrating the shielded cable according to a third embodiment.

A third embodiment will be described. The third embodiment differs from the first embodiment, among other things, in the configurations of the shielding layer 40 and the insulating layer 60. FIG. 10 is a cross sectional view illustrating the shielded cable according to a third embodiment. FIG. 10 illustrates a cross section perpendicular to the longitudinal direction of the shielded cable.

As illustrated in FIG. 10, a shielded cable 3 according to the third embodiment includes, as a shielding layer, a plating layer 43 formed on the outer peripheral surface of the insulating layer 30 in place of the shielding layer 40. A material used for the plating layer 43 is copper, for example. A thickness of the plating layer 43 is in a range greater than or equal to 0.1 µm and less than or equal to 20 µm, for example. The drain wire 50 is disposed on the outer side of the plating layer 43, in contact with the plating layer 43. The drain wire 50 is longitudinally lapped, for example. The drain wire 50 is electrically connected to the plating layer 43.

In addition, the shielded cable 3 includes an insulating layer 70, in place of the insulating layer 60. The insulating layer 70 includes a first layer 71, and a second layer 72. A material used for the first layer 71 and the second layer 72 is a resin, such as PET, PVC, or the like, for example. Thicknesses of the first layer 71 and the second layer 72 are in a range greater than or equal to 4 µm and less than or equal to 50 µm, for example. The first layer 71 is laminated on one side of the plane 51, and covers a portion of the plating layer 43 on one side of the plane 51, and the drain wire 50. Further, the second layer 72 is laminated on the other side of the plane 51, and covers a portion of the plating layer 43 on the other side of the plane 51. Further, the first layer 71 and the second layer 72 are bonded together, while continuously making contact with the plating layer 43. The insulating layer 70 has two ears 73 formed by the first layer 71 and the second layer 72 that are bonded to each other.

Other configurations of the third embodiment are similar to those of the first embodiment.

The third embodiment can obtain effects similar to the effects obtainable by the first embodiment. Moreover, in the third embodiment, the plating layer 43 functions as the shielding layer. For this reason, the distance L10 between the plating layer 43 and the central conductor 11, and the distance L20 between the plating layer 43 and the central conductor 21, can be stabilized with ease. Accordingly, it is easier to improve the transmission quality of the high-frequency signal.

Fourth Embodiment

Figure 11:
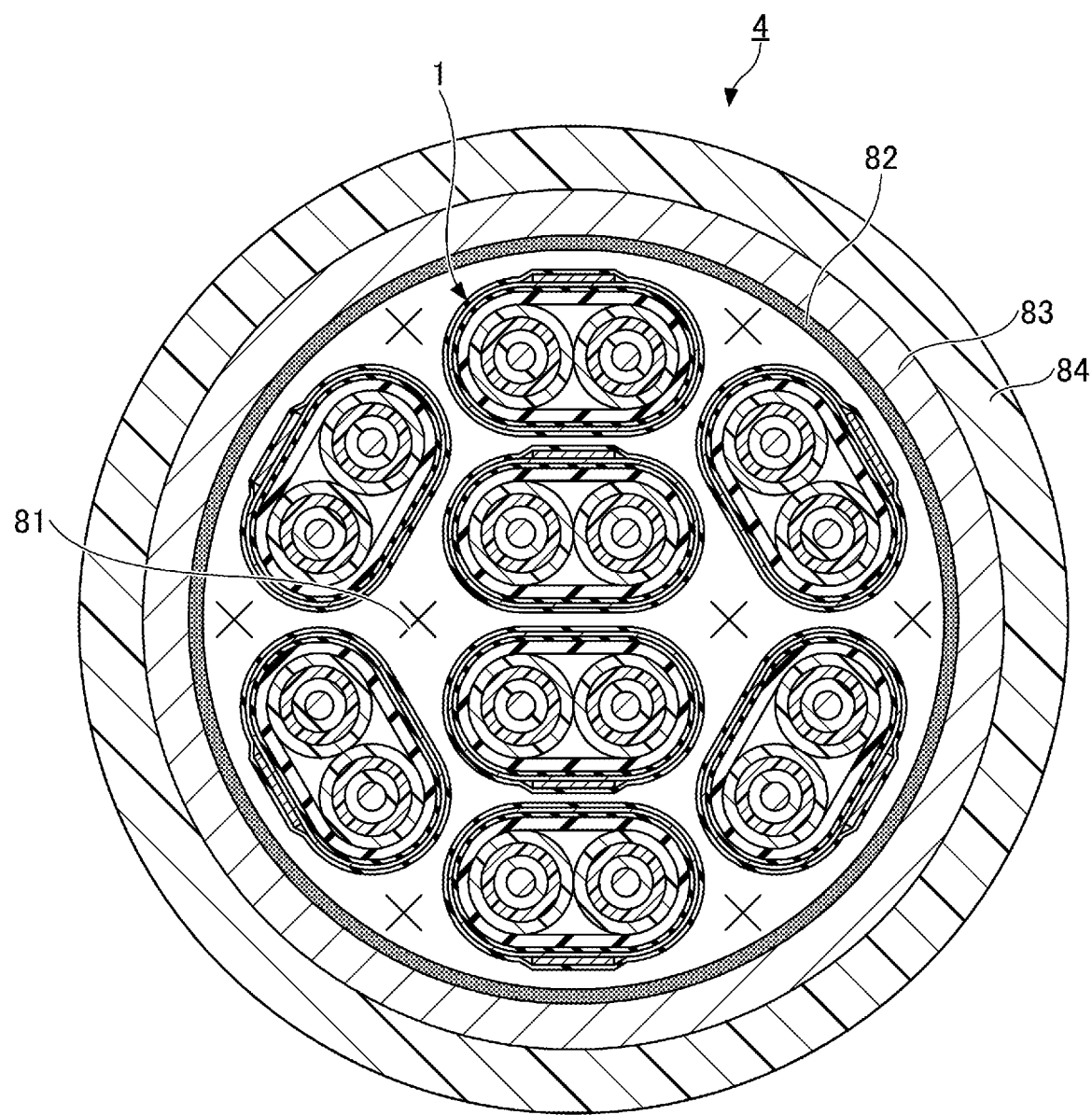
FIG. 11 is a cross sectional view illustrating a multicore cable according to a fourth embodiment.

A fourth embodiment will be described. The fourth embodiment relates to a multicore cable including the shielded cable 1 according to the first embodiment. FIG. 11 is a cross sectional view illustrating the multicore cable according to the fourth embodiment. FIG. 11 illustrates a cross section perpendicular to the longitudinal direction of the multicore cable.

As illustrated in FIG. 11, a multicore cable 4 according to the fourth embodiment includes a plurality of shielded cables 1, an inclusion 81, a laminated tape 82, a shielding layer 83, and an outer sheath (or jacket) 84. FIG. 11 illustrates an example in which the multicore cable 4 includes eight shielded cables 1.

Among the eight shielded cables 1, two shielded cables 1 are twisted together so that the drain wires 50 thereof face outward, and the other remaining six shielded cables 1 are twisted around the two twisted shielded cables 1 so that the drain wires 50 of the six shielded cables 1 face outward. For example, a twisting pitch of the two shielded cables 1, and a twisting pitch of the six shielded cables 1, are the same. The inclusion 81 is provided between the two twisted shielded cables 1 and the six twisted shielded cables 1, for example. The inclusion 81 may be provided around the six twisted shielded cables 1.

The laminated tape 82 is provided around the plurality of shielded cables 1 and the inclusion 81. The laminated tape 82 includes a PET tape, and an aluminum film, for example. The aluminum film is disposed on the outer side of the PET tape. The shielding layer 83 is provided around the laminated tape 82, and makes contact with the aluminum film of the laminated tape 82. The laminated tape 82 is wound spirally (longitudinally lapped) around the plurality of shielded cables 1 and inclusion 81. The shielding layer 83 is braided, for example. The outer sheath 84 is provided around the shielding layer 83. The outer sheath 84 accommodates the plurality of shielded cables 1. A copper film may be provided between the shielding layer 83 and the outer sheath 84.

According to the shielded cables 1 included in the multicore cable 4, the size of the shielded cables 1 can be reduced, while obtaining an excellent high-frequency signal quality. Hence, the size of the multicore cable 4 can also be reduced. In addition, the multicore cable 4 can transmit large-capacity signals. Further, because the drain wires 50 are disposed so as to face outward, it is possible to easily connect the conductive layer of the circuit board and the drain wire 50 when connecting the multicore cable 4 to the circuit board.

The multicore cable 4 may include the shielded cables 2 or the shielded cables 3, in place of the shielded cables 1.

According to the present disclosure, the size can be reduced while obtaining good high frequency signal quality.

Although the embodiments are numbered with, for example, "first," "second," "third," or "fourth," the ordinal numbers do not imply priorities of the embodiments. Many other variations and modifications will be apparent to those skilled in the art.

While the embodiments have been described, it will be understood that various variations, modifications, and substitutions may be made without departing from the spirit and scope of the present disclosure. Hence, combinations and substitutions of a part or all of each embodiment with another embodiment may be made, as appropriate.

What is claimed is:
1. A shielded cable comprising:
a first insulated wire including a first central conductor, and a first insulating layer provided around the first central conductor;
a second insulated wire including a second central conductor, and a second insulating layer provided around the second central conductor, the second insulated wire being disposed parallel to the first insulated wire;
a third insulating layer provided around the first insulated wire and the second insulated wire;
a shielding layer provided around the third insulating layer;
a drain wire in contact with the shielding layer; and
a fourth insulating layer provided around the shielding layer and the drain wire, wherein
a distance between the first central conductor and the second central conductor is less than or equal to 1.6 times a distance between the first central conductor and the shielding layer, and less than or equal to 1.6 times a distance between the second central conductor and the shielding layer,
the drain wire has a flat shape,
the first insulating layer includes
a first solid layer provided around the first central conductor,
a first foam layer provided around the first solid layer, and
a third solid layer provided around the first foam layer,
the second insulating layer includes
a second solid layer provided around the second central conductor,
a second foam layer provided around the second solid layer, and
a fourth solid layer provided around the second foam layer, and
the shielding layer includes a plating layer formed on an outer peripheral surface of the third insulating layer.

2. The shielded cable as claimed in claim 1, wherein the third insulating layer is thicker than the first solid layer, the second solid layer, the third solid layer, and the fourth solid layer.

3. The shielded cable as claimed in claim 1, wherein the shielding layer includes a metal film in contact with the drain wire.

4. The shielded cable as claimed in claim 3, wherein the drain wire is provided between the metal film and the fourth insulating layer.

5. The shielded cable as claimed in claim 3, wherein the drain wire is provided between the third insulating layer and the metal film.

6. The shielded cable as claimed in claim 1, wherein a width of the drain wire is less than or equal to a distance between the first central conductor and the second central conductor.

7. A shielded cable with a circuit board, comprising:
the shielded cable as claimed in claim 1; and
the circuit board connected to the shielded cable, wherein
the circuit board includes
an insulating base,
a first conductive layer electrically connected to the first central conductor,
a second conductive layer electrically connected to the second central conductor,
a third conductive layer electrically connected to the drain wire,
the first conductive layer, the second conductive layer, and the third conductive layer are provided on a surface of the insulating base,
the first conductive layer, the second conductive layer, and the third conductive layer extend parallel to each other, and the third conductive layer is disposed between the first conductive layer and the second conductive layer.

8. A shielded cable with a circuit board, comprising:

the shielded cable as claimed in claim 1; and the circuit board connected to the shielded cable, wherein the circuit board includes
- an insulating base,
- a first conductive layer electrically connected to the first central conductor,
- a second conductive layer electrically connected to the second central conductor,
- a third conductive layer electrically connected to the drain wire, the first conductive layer, the second conductive layer, and the third conductive layer are provided on a surface of the insulating base, the insulating base makes contact with a portion of the fourth insulating layer on an opposite side from the first central conductor and the second central conductor with reference to the drain wire, the first conductive layer and the second conductive layer extend parallel to each other, and the third conductive layer extends in a direction perpendicular to a direction in which the first conductive layer extends.

9. A multicore cable comprising:

a plurality of shielded cables each having a configuration as claimed in claim 1; and an outer sheath accommodating the plurality of shielded cables.

* * * * *